United States Patent [19]

Penniman

[11] Patent Number: 5,402,310
[45] Date of Patent: Mar. 28, 1995

[54] DOCKING APPARATUS FOR A PORTABLE DATA PROCESSING UNIT HAVING UNDERCUTS AS GUIDE MEMBERS

[75] Inventor: Mark B. Penniman, Austin, Tex.

[73] Assignee: Dell USA, L.P., Austin, Tex.

[21] Appl. No.: 92,315

[22] Filed: Jul. 14, 1993

[51] Int. Cl.⁶ .......................... H05K 5/02; H05K 7/10; G06F 1/16; H01R 13/64
[52] U.S. Cl. .................................... 361/686; 439/377; 361/727
[58] Field of Search .................. 364/708.1; 312/223.2; 439/64, 374, 377; 361/683–686, 725–727, 741, 756, 802; 345/905

[56] References Cited

U.S. PATENT DOCUMENTS 4,794,381 12/1988 Iwai .............................. 345/905 X Primary Examiner—Michael W. Phillips
Attorney, Agent, or Firm—James Huffman; Warren B. Kice

[57] ABSTRACT

An apparatus for docking a data processing unit in which a guide plate extends over a portion of the floor of a housing for receiving the bottom of the unit. Two guide members are disposed at the respective ends of the guide plate for receiving corresponding surfaces formed on said unit. Each of the guide members defines a guide surface that increases in size in a direction toward the rear wall for engagement by the corresponding surfaces of the unit to gradually center and lock the unit in the housing as the unit is inserted into the housing.

8 Claims, 4 Drawing Sheets

DOCKING APPARATUS FOR A PORTABLE DATA PROCESSING UNIT HAVING UNDERCUTS AS GUIDE MEMBERS

BACKGROUND OF THE INVENTION

This invention relates to a docking apparatus and, more particularly, to such an apparatus for docking portable data processing units of various sizes.

With the advent of portable data processing units such as handheld laptop and notebook computers, docking stations have been utilized for charging the unit's batteries as well as powering the unit and connecting it to a variety of external peripherals to transfer data to and from the unit. In the latter Context, high density multiconductor pin and socket connectors are provided on the data processing unit and the docking station and are adapted to transfer the appropriate electrical signals. Since the pins in these connectors, as well as their corresponding sockets have to be closely spaced, precise alignment of the portable unit in the docking station is critical.

The side-to-side alignment of the portable unit relative to the docking station is typically controlled by closely matching the distance between two upright side walls of the docking station with the width of the data processing unit. Thus it is impossible to accommodate units having even a slight variation in width since this would compromise the above-mentioned electrical connectors. Moreover, these walls prevent side access to computer communications (PMACIA) cards and the like.

Further problems exist in prior art docking stations in connection with accommodating portable data processing units having different heights, or thicknesses. More particularly, most prior art docking stations provide a lower wall, or floor, on which the unit slides into place with the assistance of gravity while an upper, or top, wall is not provided in order to accommodate units of different heights. However, this permits unrestricted upward movement of the unit and thus exposes the mated electrical connectors to damage when a lifting force is applied to the data processing unit. Some docking stations utilize various techniques, such as the provision of cooperating rails and tracks on the respective side walls of the portable unit and the docking station to eliminate this upward movement. However, these designs prevent the use of ports or the like on the side walls of the portable unit, usually involve extra parts, are obtrusive and add to the cost and complexity to the docking station.

SUMMARY OF THE INVENTION

It is therefore an object of the present invention to provide a docking apparatus for docking data processing units having various sizes.

It is a further object of the present invention to provide a docking apparatus of the above type which also prevents upward movement of the docked data processing unit.

It is still a further object of the present invention to provide a docking assembly of the above type which insures proper alignment of the data processing unit while permitting ports, and the like in the side walls of the unit.

It is still a further object of the present invention to provide a docking apparatus of the above type which achieves the foregoing by a discrete and unobtrusive design which is relatively inexpensive.

It is a still further object of the present invention to provide a docking apparatus of the above type which is easy to manufacture and does not require extra parts.

Towards the fulfillment of these and other objects the docking apparatus of the present invention includes a housing for receiving the portable unit and having a guide plate extending on the floor of the housing. Two guide members are respectively disposed at the ends of the guide plate for receiving corresponding surfaces formed on the unit. Each of the guide members has an undercut which defines a guide surface that increases in width and height in a direction towards the rear wall to gradually center and lock the unit in the housing as the unit is inserted in the housing.

BRIEF DESCRIPTION OF THE DRAWINGS

The above brief description, as well as further objects, features and advantages of the present invention will be more fully appreciated by reference to the following detailed description of the presently preferred but nonetheless illustrative embodiments in accordance with the present invention when taken in conjunction with the accompanying drawings wherein.

DESCRIPTION OF THE PREFERRED EMBODIMENT

Figure 1:
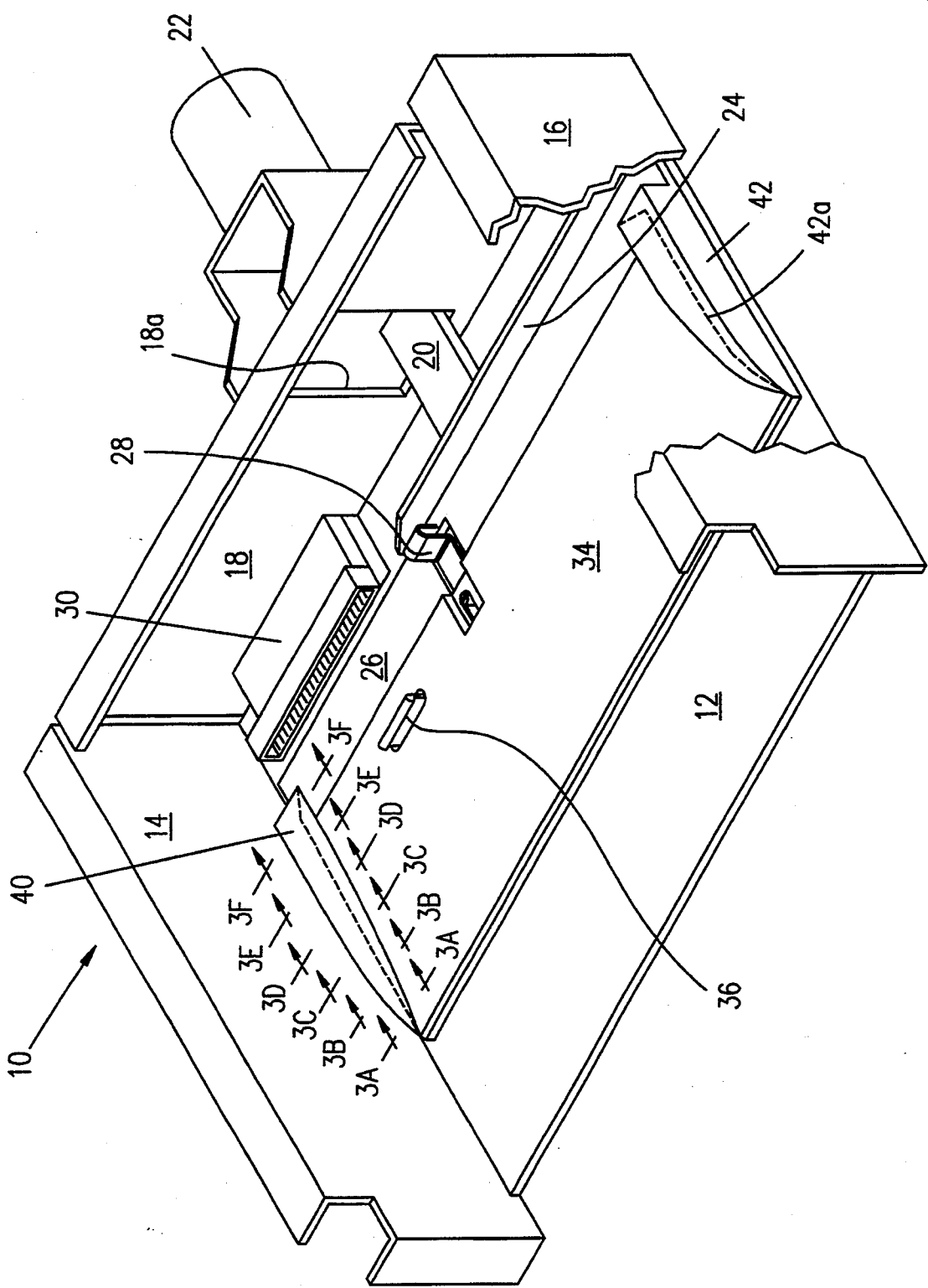
FIG. 1 is a perspective view depicting the docking apparatus of the present invention.

The docking apparatus of the present invention is shown in general by the reference numeral 10 in FIG. 1 and includes an open housing having a floor 12, two upright spaced sidewalls 14 and 16, and a rear wall 18. A slot, or opening, 18a is provided in the rear wall 18 through which a drive bar 20 extends. The drive bar 20 is connected between a motor 22 mounted externally of the rear wall 18 and a drive rail 24 which is connected to, or integral with, a moveable platform 26 resting on the floor 12. An electrically actuated trip switch 28 extends through aligned openings formed in the floor 12 and the platform 26 and in the path of the portable unit to be docked, to actuate the motor 22 and drive the platform 26 in a direction toward the rear wall 18 as will be described.

A guide plate 34 extends over and rests on the platform 26 and is attached thereto in any known manner. The guide plate 34 extends for the entire width of the platform 26 and from the leading edge of the platform to a position slightly spaced from the opposite or rear edge of the platform, as shown. A high-density, multi-pin connector assembly 30 extends from the rear wall 18 with its leading end positioned immediately adjacent the platform 26. Although not clear from the perspective view of FIG. 1, it is understood that the connector assembly 30 is slightly spaced above the platform 26 to permit movement of the platform under the assembly 30, as also will be described. A retractable tab 36 extends through elongated slots formed in the floor 12, the platform 28 and the guide plate 34 to mechanically engage a corresponding slot formed in the bottom of the docked portable unit. Two guide members 40 and 42 are provided at the respective ends of the plate 34 and can be formed integrally with the latter plate. The guide members 40 and 42 will be described in detail.

Figure 2:
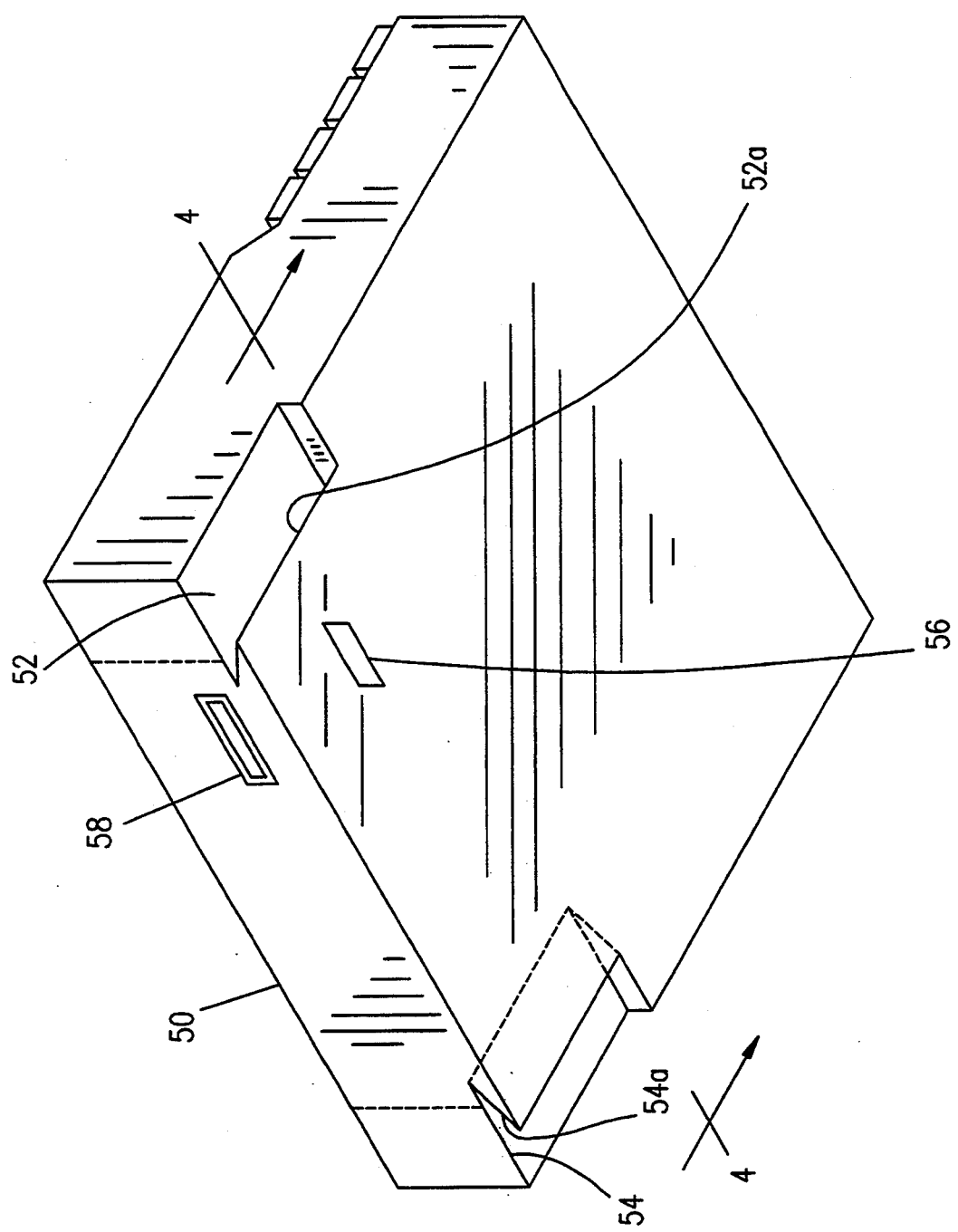
FIG. 2 is a perspective view of the lower, rear portion of a data processing unit adapted for docking to the apparatus of FIG. 1.

FIG. 2 depicts a portable data processing unit, such as a laptop computer 50, which is adapted to be docked in the apparatus 10. To this end, a pair of notches 52 and 54 are formed in the lower rear portion of the unit 50 which engage the guide members 40 and 42 during docking to guide and secure the unit 50 relative to the apparatus 10. Each of the notches 52 and 54 has a diagonal undercut which defines diagonal surfaces 52a and 54a, respectively. The notches 52 and 54 and their respective diagonal surfaces 52a and 54a extend from the rear of the unit 50 to a point approximately intermediate its front end and rear end.

A slot 56 is provided in the lower plate, or floor, of the unit 50 for receiving the tab 36 of the docking apparatus 10, and a multi-socket connector assembly 58 is provided in the rear end of the unit 50 for mechanically and electrically engaging the connector assembly 30 of the apparatus 10, as also will be described.

Figure 3A:
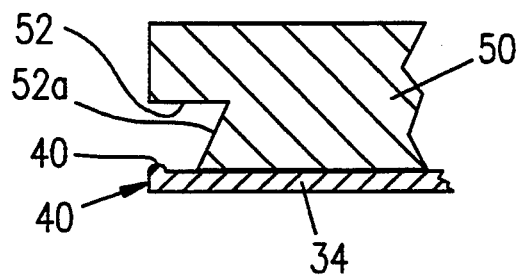
FIGS. 3A-3F are sectional views taken along the lines 3A—3A through 3F—3F, respectively, of FIG. 1.
Figure 3B:
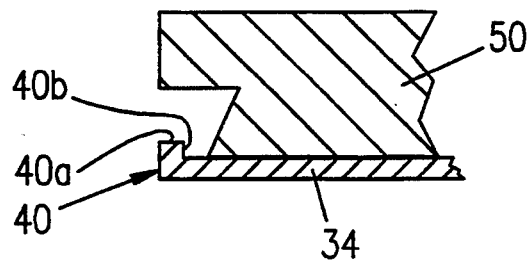
Figure 3C:
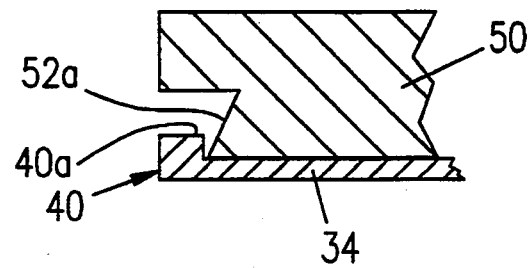
Figure 3D:
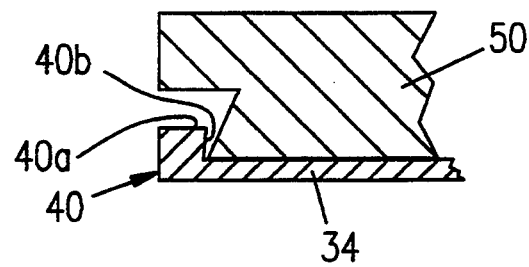
Figure 3E:
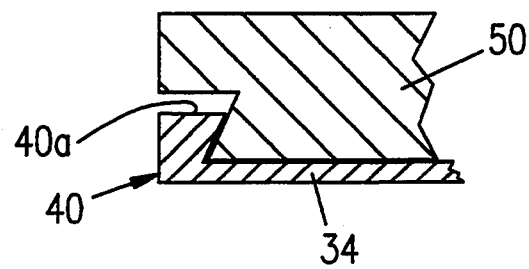
Figure 3F:
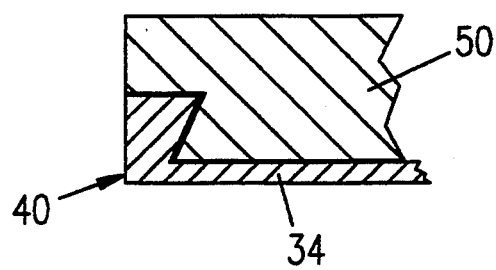
Figure 4:
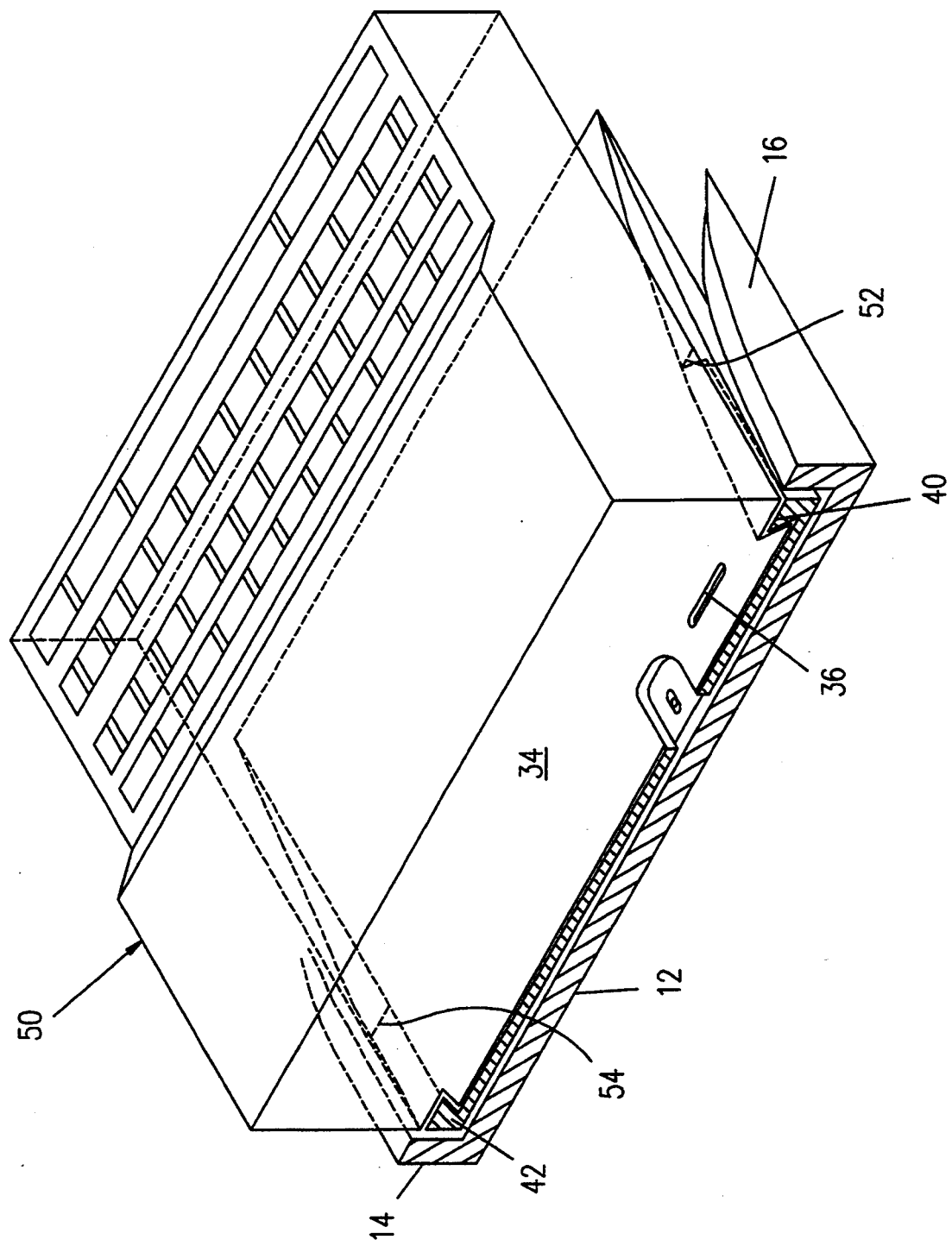
FIG. 4 is a rear perspective view of the apparatus of FIG. 1 along with the docked portable data processing unit of FIG. 2.

The shape of the guide member 40 and its relation to the unit 50 is shown with reference to FIGS. 3A-3F, it being understood that the guide member 42 is shaped similarly. As shown the guide member 40 tapers in cross-section from a relatively small size at the leading edge of the plate 34 (FIG. 3A) to a full size (FIG. 3F) approximately midway between the leading edge and the rear edge of the plate. The guide member 40 has an upper bearing surface 40a which is horizontal for most of its length for receiving the corresponding upper horizontal surface of the computer 50 defining the notch 52. Also, an undercut 40a is provided in the guide member 40 which, due to the tapering nature of the member, defines a guide surface 42b that also varies in size as shown. Specifically, the guide surface 40b starts with a relatively small dimension, both with respect to height and width at its front end as shown in FIG. 2A, i.e., the end located adjacent the leading edge of the plate 34, and increases both with respect to width and height along its length until, approximately at its intermediate point, it attains its full shape as shown in FIG. 3F. The guide surface 40b also extends substantially vertically for a portion of the intermediate length of the guide member 40, as shown in FIGS. 3B and 3C, and then gradually attains an angular orientation towards the rear end portion of the guide member, as shown in FIGS. 3D-3F. The guide member 42 is configured identically to the guide member 40 with the exception that the undercut of the guide member 42 faces to the left as viewed in FIG. 1. The surfaces 52a and 54a of the notches 52 and 54, respectively, of the unit 50 are complementary to the guide surfaces 40b and 42b, respectively, so that the guide surfaces 40b and 42b extend in the spaces defined by the undercuts in the unit 50, and the surfaces 52a and 54a extend in the undercuts of the guide members 40 and 42, respectively, as shown in FIG. 4. (The guide members 40 and 42 are shown slightly spaced from the corresponding surfaces, including the surfaces 52a and 54, defining the notches 52 and 54, respectively, in the interest of clarity.)

To dock the unit 50 in the apparatus 10, the rear end of the unit is inserted between the sidewalls 14 and 16 and the unit is pushed towards the rear wall 18. Initially the width of the guide surfaces 40a and 42a are at a minimum as shown in FIG. 3A, thus enabling the unit 50 to easily be located between the guide members 40. In this context, and for the purposes of this example, the unit 50 is depicted in FIG. 3A as being slightly off center by virtue of being slightly too far to the left, as viewed in the drawing and from the front of the unit, relative to the guide plate 34.

As the unit 50 moves towards the rear wall 18, the space between the guide surfaces 40b and 42b progressively decreases as the widths of the guide surfaces increase, thus enabling the unit 50 to be centered as it approaches the intermediate portions of the guide plate 34. More particularly, and as shown in FIGS. 3D and 3E, the guide surface 40b engages the surface 52a of the unit 12 and biases, or cams, it in a direction from left to right until it attains the centered position shown in FIG. 3E (and FIG. 3F). Due to the fact that the respective heights of the guide surfaces 40b and 42b also progressively increase in a direction towards the wall ! 8, the unit 50 is lifted upwardly by virtue of the engagement of the upper surface of the slot 52 with the bearing surface 40a until the unit 50 attains the vertically centered position of FIG. 3F. Thus the unit 50 is centered both laterally and vertically in the apparatus 10.

Further movement of the unit 50 toward the rear wall 18 locks the unit between the guide members 40 and 42 in the locked position shown in FIGS. 3F and FIG. 4 with the guide surfaces 40b and 42b extending in the undercuts defining the surfaces 52a and 54a, respectively, and visa versa. In this position the retractable tab 36 extend in the slot 56 formed in the floor of the unit 50 and the trip switch 28 is engaged by the unit and actuated. The motor 22 thus drives the platform 28, via the bar 20, toward the rear wall until the connector assembly 56 of the unit 50 engages the connector assembly 30 of the apparatus 10. The motor 22 is then deactivated and the unit 50 is completely docked in the apparatus 10 with the respective connector assemblies 30 and 58 in electrical and mechanical engagement. Of course, the unit 50 can be disengaged from the docking apparatus 10 by actuating a switch or the like (not shown) which reverses the above process.

According to another feature of the present invention, the width of the unit 20 can vary between a maximum width as shown by the solid line in FIG. 2 and a minimum width as shown by the dashed lines, since these variations do not alter the sizes of the notches 52 and 54, their undercuts 52a and 54a and the guide surfaces defined thereby. Also, units 50 of varying heights, or thicknesses, can be accommodated.

Other advantages of the present invention include the ability to provide ports, or the like, in the sidewalls of the unit 50, since rails or the like are not used. Further, the docking apparatus of the present invention achieves all of the foregoing by a discreet and unobtrusive design which is relatively simple and inexpensive to manufacture. Also the notches 52 and 54 can be formed in the unit 50 with conventional injection molding techniques without any additional steps.

A latitude of modification, change and substitution is intended in the foregoing disclosure and in some instances some features of the invention will be employed without a corresponding use of other features. Accordingly, it is appropriate that the appended claims be construed broadly and in a manner consistent with the scope of the invention.

What is claimed is:

1. A docking apparatus for docking a data processing unit having surfaces defined by diagonal undercuts said docking apparatus comprising a housing having a rear wall, a floor extending from said rear wall, a guide plate extending over a portion of the floor for receiving the bottom of the unit, and two guide members respectively disposed at the ends of said guide plate for respectively receiving corresponding surfaces formed on the unit, each of said guide members defining a guide surface that increases in size in a direction toward said rear wall for respectively engaging the surfaces on the unit to gradually guide the unit to a centered and locked position with respect to said housing.

2. The apparatus of claim 1 wherein said guide surfaces of said guide members increase in width in a direction towards said rear wall whereby said guide members center and lock the unit laterally with respect to said housing.

3. The apparatus of claim 1 wherein said guide surfaces of said guide members increase in height in a direction towards said rear wall whereby said guide members center and lock the unit vertically with respect to said housing.

4. The apparatus of claim 1 wherein said guide surfaces are formed by diagonal undercuts in said respective guide members which correspond to the undercut surfaces formed on the unit.

5. The apparatus of claim 4 wherein said guide surfaces of said guide members extend in the respective undercuts of the unit, and surfaces of the unit extend in the respective undercuts of said guide members, in said centered and locked position of the unit.

6. The apparatus of claim 1 wherein said guide members are formed integrally with said guide plate.

7. The apparatus of claim 1 further comprising a platform extending over said floor of said housing for receiving said guide plate, and means for advancing said platform towards said rear wall of said housing to complete said docking.

8. The apparatus of claim 1 wherein the upper surface of each of said guide members adjacent its corresponding guide surface acts as a bearing surface for corresponding surfaces of the unit.

* * * * *